United States Patent [19]
Bean et al.

[11] 3,911,559
[45] Oct. 14, 1975

[54] METHOD OF DIELECTRIC ISOLATION TO PROVIDE BACKSIDE COLLECTOR CONTACT AND SCRIBING YIELD

[75] Inventors: Kenneth E. Bean; Albert Neal Akridge, both of Richardson, Tex.

[73] Assignee: Texas Instruments Incorporated, Dallas, Tex.

[22] Filed: Dec. 10, 1973

[21] Appl. No.: 423,631

[52] U.S. Cl. .................... 29/578; 29/580; 148/175; 148/187; 156/3; 156/7; 156/17

[51] Int. Cl.² ................ H01L 21/304; H01L 21/306; H01L 21/36

[58] Field of Search .......... 156/7, 8, 17, 3; 148/175, 148/188, 187; 117/212, 215; 29/578, 580, 583

[56] References Cited

UNITED STATES PATENTS

| | | | |
|---|---|---|---|
| 3,508,980 | 4/1970 | Jackson et al. | 148/175 |
| 3,623,218 | 11/1971 | Mitari et al. | 156/17 |
| 3,702,790 | 11/1972 | Nakanuma et al. | 148/175 |
| 3,703,420 | 11/1972 | Vora | 148/175 |
| 3,725,751 | 4/1973 | Wakamiya | 148/175 |
| 3,791,882 | 2/1974 | Ogiue | 148/175 |
| 3,825,451 | 7/1974 | Schoeff | 156/17 |

*Primary Examiner*—Charles E. Van Horn
*Assistant Examiner*—Jerome W. Massie
*Attorney, Agent, or Firm*—Hal Levine; James T. Comfort; Gary C. Honeycutt

[57] ABSTRACT

The disclosure relates to a method in bipolar technology of providing a back contact to the collector of a semiconductor device through a dielectrically isolated circuit to reduce saturation resistance and to provide a continuous region of single crystal semiconductor material extending through the entire slice to provide scribe lines extending entirely through the single crystal material to provide much higher scribing yields. The above is provided by depositing an oxide layer over a single crystal substrate and selectively removing portions of the oxide which will later be either scribe points or be positioned beneath the collector of the transistor to be formed. Semiconductor material is then deposited over the oxide layer, this material depositing on the oxide layer and also on the silicon substrate in the region where the oxide has been removed. A buildup will be provided which is polycrystalline over the oxide layer and single crystal over the region wherein the deposited silicon is directly in contact with the silicon substrate. The silicon substrate is then ground and polished back and an epitaxial layer is then deposited thereon. In the case of the scribe lines, an oxide coating is then placed over the topmost semiconductor layer and portions of the oxide are removed over the scribe lines. An orientation dependent etch is then provided through the semiconductor material bound to the scribe lines. Normal scribing techniques could also be used to provide a relatively high yield as compared with the prior art along the scribe lines.

4 Claims, 1 Drawing Figure

Figure 1A:
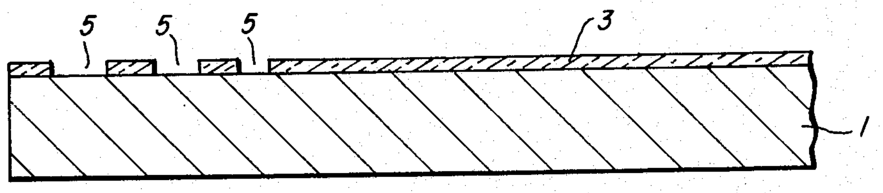

METHOD OF DIELECTRIC ISOLATION TO PROVIDE BACKSIDE COLLECTOR CONTACT AND SCRIBING YIELD

This invention relates to a method of providing improved dielectric isolation processes to provide backside collector contact and improved scribing yield in the manufacture of semiconductor devices. In the present production of dielectrically isolated circuits, there is no provision made to promote easy backside collector contact, or scribing to separate the various circuits, on semiconductor wafers. Scribing is provided through polycrystalline silicon and silicon dioxide or in some cases through polycrystal silicon, silicon dioxide and single crystal silicon. When scribing through materials which are not single crystal, cleavage of the material can take place in random fashion rather than along the scribe lines and therefore provide breakage of many of the components of the wafer. This leads to low yield from processing and therefore, higher ultimate cost. The prior art has also required deep diffusion from the top surface of a semiconductor material to form the collector contact. This leads to high collector saturation voltage, high collector contact resistance and slow saturation time, all of these being undesirable properties.

In accordance with the present invention, processes have been provided wherein it is possible to scribe through single crystal silicon or etch through single crystal silicon to expose the contact in a beam lead structured circuit. Scribing through single crystal silicon increases bar yield over scribing through polycrystalline silicon or a combination of polycrystalline silicon dioxide and single crystal silicon embodiments. Also, direct contacting of backside collector regions eliminates the problems associated with deep diffusion from the top surface, these being to provide decreases in collector contact resistance as well as reduction in collector saturation voltages.

Briefly, the process of the present invention makes use of a change in the mask sequence following the normal separation oxide. By opening the separation oxide in a gap-mask pattern, nucleation of quasi single crystal silicon is provided in the open region during the normal polycrystalline silicon deposition over the oxide. This quasi single crystal silicon is then used for purposes of scribing as well as providing a backside contact to the collector region of the semiconductor.

It is therefore an object of this invention to provide a method of improved scribing yield of semiconductor devices.

It is a further object of this invention to provide a method of forming a backside contact to the collector region of a semiconductor device.

It is a yet further object of this invention to provide a method of forming a continuous zone of substantially single crystal semiconductor material between formed polycrystalline regions to provide scribing regions and a backside contact for the collector of a semiconductor device.

It is a yet further object of this invention to provide a process for causing nucleation of quasi single crystal silicon at selected regions during the normal polycrystalline silicon deposition to form scribe lines and/or backside contacts for semiconductor layers.

It is a still further object of this invention to provide a semiconductor wafer with improved scribing yield.

It is a still further object of this invention to provide a semiconductor device having a backside contact to the collector region.

The above objects and still further objects of the invention will immediately become apparent to those skilled in the art after consideration of the following preferred embodiment thereof, which is provided by way of example and not by way of limitation, wherein:

The FIGURE is a step-by-step showing of the process steps of the method in accordance with the present invention.

Figure 1B:
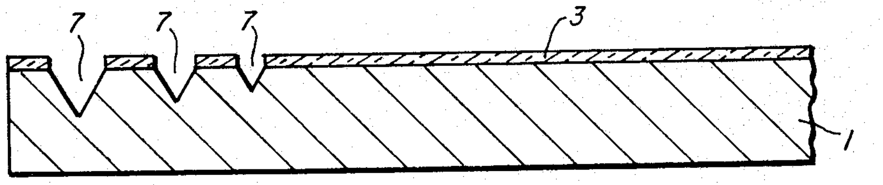

The process for fabrication of a JFET starts by utilizing a *p*+ (100) crystallographically oriented silicon substrate. It should be understood that the starting material could be n+ and the substrate could have other crystallographic orientation with the subsequent processing steps being suitably altered as would be apparent to those skilled in the art. The starting substrate 1 is (100)*p*+ silicon in the range of 0.008 to 0.01 ohm-cm resistivity. A thickness indicator mask of oxide 3 is thermally grown or deposited over the substrate, this being in the thickness range of 6,000 A. The thickness indicator mask is aligned for etching parallel with the traces of the (111) planes on the (100) surface. This mask has the oxide open in a pattern 5 of parallel lines of different widths as shown in FIG. 1a. The orientation dependent etch is now provided through the mask openings. The etch front terminates along {111} planes that intersect the (100) silicon surface at an angle of 54.74°. The depth of the orientation dependent etch (ODE) is dependent upon the width of the opening 5 in the oxide due to the etching angle since the etching lines will meet as shown in FIG. 1*b* to provide the thickness indicators 7.

Figure 1C:
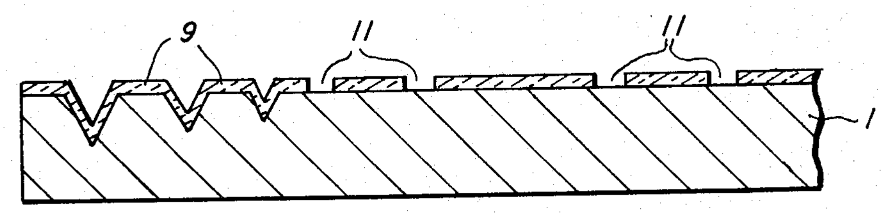
Figure 1D:
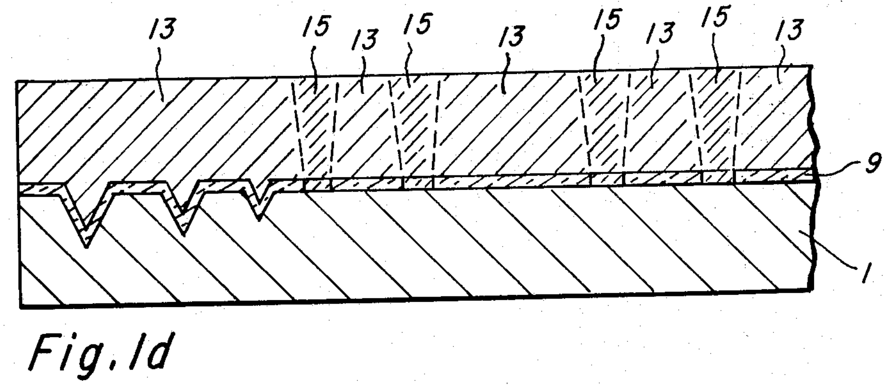

The remaining oxide is removed and a new separation oxide 9 is thermally grown or vapor deposited over the substrate and openings 11 in the separation oxide are made by the use of a gap mask around the periphery of each circuit to be formed on the substrate. In addition, a gap opening may be provided in the mask to form a backside contact, if desired, to the collector region of a semiconductor bipolar device to be formed as shown in FIG. 1*c*. Silicon is then deposited over the oxide coating and polycrystalline silicon 13 is formed in all regions over the oxide coating whereas a quasi single crystal nucleation and deposition of silicon 15 takes place in those regions of the gap openings. The single crystal area around the circuit periphery is used to control the final scribing of the circuit bars in the beam lead process. For circuits with conventional metallization and chip separation, this quasi single crystal material permits improved scribe and break yields since the natural {111} cleavage planes can be utilized for cleavage after diamond scribing. Conventional dielectrically isolated integrated circuits have polycrystalline silicon in the scribe lines, therefore resulting fractures are uneven and may extend into active circuit areas with a consequent yield loss.

Figure 1E:
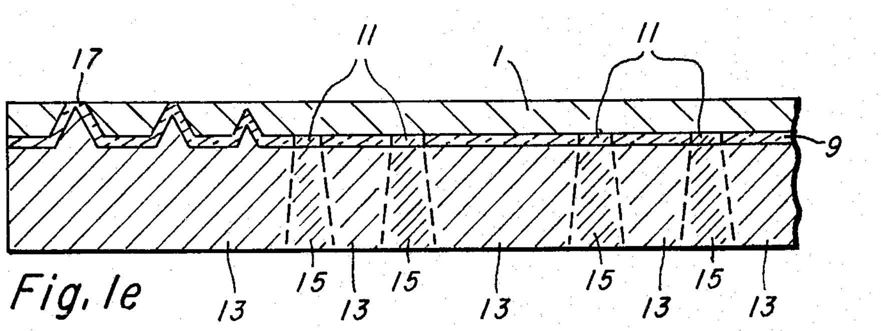
Figure 1F:
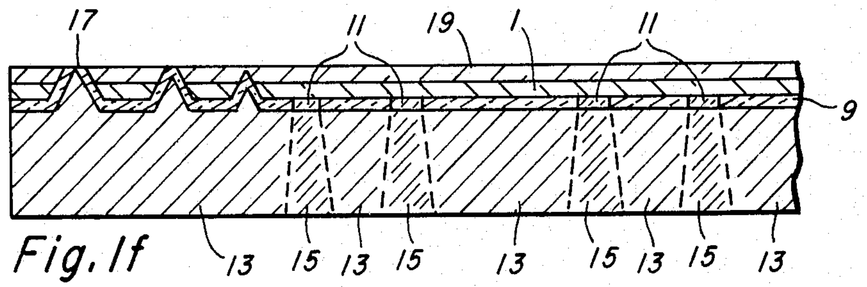
Figure 1G:
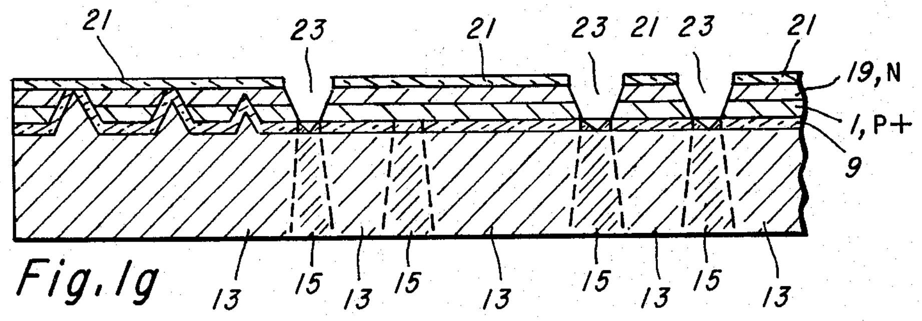

The slices are then ground and polished as shown in FIG. 1*e* until the *p*+ substrate material 1 is 10 microns thicker than the desired back gate thickness. This can be determined by the appearance of the first thickness indicator 17 at the surface. The slices are then placed in an epitaxial reactor and about 10 microns of the original substrate 1 is vapor etched off of the surface with HCl vapor to remove all surface damage as shown in FIG. 1*f*. An epitaxial film 19 of n-type corresponding to the desired channel thickness and resistivity for a JFET or collector and/or base resistivity P + T for a bipolar transistor is then deposited over the remaining substrate using a low temperature epitaxial process. A low temperature oxide 21 at 1,000°C or less or nitride is formed on the surface as shown in FIG. 1*g*. The isolation etch mask is aligned and the slices are subjected to an orientation dependent etch which forms isolation grooves 23 terminating at apertures 11 of the separator oxide layer 9. The slices are now ready for final device processing including metallization thereof. It can be seen that the backside contact to the backside gate or collector region extends through via quasi single crystal regions 15 to the bottom surface of the wafer where metallization can be affixed in standard manner. Scribing can take place along any of the regions 15 which do not rest beneath oxide with minimal scribing loss since the scribe lines are totally over quasi single crystal silicon.

This dielectric isolation process not only makes use of the epitaxial film control for exact channel thickness and resistivity control, but also utilizes a low temperature 1,050°C epitaxial deposition at the normally high temperature material process step in FIG. 1*f*. This low temperature epitaxial film deposition may be made from 0.5 percent silane ($siH_4$) in hydrogen at 1,050°C. Epitaxial films from 0.25 percent dichlorosilane ($siH_2Cl_2$) in hydrogen at 1,050°C provides equivalent results.

It should be noted that the slope of the isolation etch termination in FIG. 1*g* can be changed from 54.74° when aligned with the {111} traces perpendicular to the <110> directions, to a less steep angle of 46.51° by aligning the mask with the trace of the {331} planes or perpendicular to the <310> directions. However, the steeper slope provides higher packing densities.

After the oxidation or nitride growth as shown in FIG. 1*g*, JFET's can be formed with only two diffusion processing steps, a *p*+ top gate diffusion and a shallow *n*+ deposition in the source and drain contact areas to provide good ohmic contact with the circuit metallization. Consistent with the previously mentioned JFET design the *n*+ channel epitaxial layer thickness is 5.8 to 6.8 microns and the resistivity is 0.4 to 0.6 ohm-cm. Thus, a top gate *p*+ diffusion depth of 1.5 to 2.8 microns is required.

Two approaches to the *p*+ diffusion are employed for the JFET circuit. The circuit is designed to be compatible with conventional diffusion techniques but ion implantation provides more uniform p+ source than conventional boron tribromide ($BBr_3$) vapor deposition.

It will be apparent that these structures are useful in the integration of power devices with logic circuits, for example. That is, the power devices can be provided with back-side collector contacts; on the same chip with conventional integrated circuitry having top-side contacts.

It can be seen that there has been provided a method of improved scribing yield as well as providing backside collector contacts to semiconductor devices in accordance with the present invention.

Although the invention has been described with respect to a specific preferred embodiment, many variations and modifications will immediately become apparent to those skilled in the art. It is therefore the intention that the appended claims be interpreted as broadly as possible in view of the prior art to include all such variations and modifications.

What is claimed is:

1. A method of forming a semiconductor structure useful in the fabrication of semiconductor devices which comprises the steps of:

a. selectively etching a monocrystalline semiconductor substrate to provide therein a plurality of thickness indicator grooves extending into the surface of said semiconductor substrate to a precisely determined depth, at least two of said grooves having different depths;

b. forming a selectively apertured mask on said semiconductor surface, said apertures having discrete locations spaced from said grooves;

c. exposing the resulting masked semicondutor surface to epitaxial growth conditions whereby polycrystalline semicondutor deposits are formed on said oxide layer, concurrently with the formation of monocrystalline semiconductor material at said aperture locations whereby the resulting semiconductor deposit is characterized by a polycrystalline matrix having single crystal regions extending therethrough;

d. thinning the original semiconductor substrate from the backside thereof until one or more of said thickness indicator grooves is exposed;

e. growing an epitaxial semiconductor film on the backside of the remaining original semiconductor substrate; and f. selectively etching grooves through the original semiconductor substrate having said epitaxial layer thereon such that at least one etched groove is located in registry with one of the monocrystalline regions extending through said polycrystalline deposit.

2. A method as in claim 1 wherein said original semiconductor substrate surface is crystallographically oriented in a (100) plane, and wherein said thickness indicator grooves have sidewalls lying in a (111) crystallographic plane.

3. A method as in claim 1 wherein said original substrate is of p-type conductivity having low resistivity, and wherein the epitaxial film deposited on the backside of said thinned original substrate is of n-type conductivity.

4. A method as in claim 1 wherein said final etching step is achieved by orientation dependent etching to produce isolation grooves having sidewalls oriented along (111) planes.

* * * * *